US012310008B2

United States Patent
(12) United States Patent
Ding

(10) Patent No.: US 12,310,008 B2
(45) Date of Patent: May 20, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Li Ding, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 503 days.

(21) Appl. No.: 17/748,088

(22) Filed: May 19, 2022

(65) Prior Publication Data

US 2023/0225118 A1 Jul. 13, 2023

Related U.S. Application Data

(63) Continuation of application No. PCT/CN2022/078909, filed on Mar. 2, 2022.

(30) Foreign Application Priority Data

Jan. 10, 2022 (CN) ........................ 202210022035.X

(51) Int. Cl.

| | |
|---|---|
| ***H10B 20/25*** | (2023.01) |
| ***H01L 23/525*** | (2006.01) |
| ***H01L 23/535*** | (2006.01) |
| ***H10B 20/00*** | (2023.01) |

(52) U.S. Cl.

CPC ......... *H10B 20/25* (2023.02); *H01L 23/5252* (2013.01); *H01L 23/535* (2013.01); *H10B 20/38* (2023.02)

(58) Field of Classification Search

CPC ..... H01L 21/823425; H01L 21/823481; H01L 21/823878; H01L 23/535; H01L 29/0649; H01L 29/78; H01L 23/5252; H10B 20/25; H10B 20/38; H10D 30/0227;

(Continued)

(56) References Cited

U.S. PATENT DOCUMENTS 5,780,899 A * 7/1998 Hu ........................ H01L 27/092 257/350
9,142,446 B2 9/2015 Yang
9,159,734 B2 10/2015 Hafez (Continued)

FOREIGN PATENT DOCUMENTS

CN 102347333 A 2/2012
CN 103531589 A 1/2014

(Continued)

*Primary Examiner* — Brook Kebede

(74) *Attorney, Agent, or Firm* — Kilpatrick Townsend & Stockton LLP

(57) ABSTRACT

A semiconductor structure and a method for manufacturing the semiconductor structure are provided. The semiconductor structure includes: a substrate including a first doped region; a first isolation structure located in the first doped region, a depth of the first isolation structure being greater than that of the first doped region; a first gate structure located on the surface of the substrate of the first doped region and spanning the first isolation structure, a projection width of the first gate structure on the substrate being larger than that of the first isolation structure on the substrate; and second gate structures located on the surface of the substrate and at both sides of the first gate structure.

17 Claims, 10 Drawing Sheets

(58) Field of Classification Search
CPC .. H10D 30/0285; H10D 30/637; H10D 30/65; H10D 62/116; H10D 64/512; H10D 84/83
See application file for complete search history.

(56) References Cited

U.S. PATENT DOCUMENTS

| | | | | |
|---|---|---|---|---|
| 9,748,252 | B2 | 8/2017 | Hafez | |
| 10,032,522 | B2 | 7/2018 | Luan et al. | |
| 2003/0230786 | A1* | 12/2003 | Kim | H01L 29/0649 257/E21.426 |
| 2013/0270559 | A1 | 10/2013 | Hafez | |
| 2014/0151793 | A1* | 6/2014 | Cha | H01L 29/7816 257/288 |
| 2015/0076555 | A1 | 3/2015 | Yang et al. | |
| 2016/0035735 | A1 | 2/2016 | Hafez et al. | |
| 2016/0111320 | A1* | 4/2016 | Shen | H01L 21/823437 438/424 |

FOREIGN PATENT DOCUMENTS

| | | | |
|---|---|---|---|
| CN | 104025293 | A | 9/2014 |
| CN | 104347589 | A | 2/2015 |
| CN | 107492553 | A | 12/2017 |

* cited by examiner

SEMICONDUCTOR STRUCTURE AND METHOD FOR MANUFACTURING SAME

CROSS-REFERENCE TO RELATED APPLICATIONS

This application is a U.S. continuation application of International Application No. PCT/CN2022/078909, filed Mar. 2, 2022, which claims priority to Chinese Patent Application No. 202210022035.X, filed Jan. 10, 2022. International Application No. PCT/CN2022/078909 and Chinese Patent Application No. 202210022035.X are incorporated herein by reference in their entireties.

BACKGROUND

A one-time programmable (OTP) memory is a nonvolatile memory that supports one-time programming, and is widely used in analog circuit field, digital chip/SOC field, SRAM/DRAM field and so on. Disposable anti-fuse programmable memory is a kind of one time programmable memory. In the unprogrammed state, the anti-fuse memory presents a high-resistance state due to the existence of an insulating dielectric layer. After programming, the insulating dielectric layer is broken down, and the anti-fuse memory presents a low-resistance state, thus completing a writing operation.

However, with the rapid development of integrated circuit technologies, the density of devices in integrated circuits is getting higher and higher, and the sizes of semiconductor devices are shrinking to meet the demand. Therefore, it is an urgent problem to be solved to reduce the sizes of semiconductor devices of the disposable anti-fuse programmable memory.

SUMMARY

Embodiments of the disclosure relate to the semiconductor field, in particular to a semiconductor structure and a method for manufacturing the same.

Embodiments of the disclosure provide a semiconductor structure, which includes a substrate, a first isolation structure, a first gate structure and second gate structures. The substrate includes a first doped region. The first isolation structure is located in the first doped region, and a depth of the first isolation structure is greater than that of the first doped region. The first gate structure is located on a surface of the substrate of the first doped region and spans the first isolation structure. A projection width of the first gate structure on the substrate is greater than that of the first isolation structure on the substrate. The second gate structures are located on the surface of the substrate and at both sides of the first gate structure.

According to some embodiments of the disclosure, another aspect of the disclosure also provides a method for manufacturing a semiconductor structure, which includes: providing a substrate including a first isolation structure; forming a first gate structure on a surface of the substrate, in which the first gate structure spans the first isolation structure, and a projection width of the first gate structure on the substrate is greater than that of the first isolation structure on the substrate; forming second gate structures on the surface of the substrate, in which the second gate structures are located at both sides of the first gate structure; and forming a first doped region in the substrate, in which the first isolation structure is located in the first doped region, and a depth of the first isolation structure is greater than that of the first doped region. The first gate structure is located on the surface of the substrate of the first doped region.

BRIEF DESCRIPTION OF THE DRAWINGS

One or more embodiments are illustrated with figures corresponding thereto in the drawings. These exemplary illustration do not constitute limitations to the embodiments, and unless otherwise stated, the figures in the drawings do not constitute scale limitations. In order to more clearly explain technical solutions in the embodiments of the disclosure or the related art, the drawings required in the embodiments will be briefly introduced below. Apparently, the drawings in the following description are only some embodiments of the disclosure. For an ordinary person skilled in the art, other drawings may be obtained according to these drawings without any creative effort.

DETAILED DESCRIPTION

The embodiments of the disclosure provide a semiconductor structure, which includes a substrate including a first doped region; a first isolation structure, in which the first isolation structure is located in the first doped region, and a depth of the first isolation structure is greater than that of the first doped region; a first gate structure, in which the first gate structure is located on a surface of the substrate of the first doped region and spans the first isolation structure, and a projection width of the first gate structure on the substrate is greater than that of the first isolation structure on the substrate; second gate structures, in which the second gate structures are located on the surface of the substrate and are located at both sides of the first gate structure. In the embodiments of the disclosure, the first gate structure spans the first isolation structure and is in contact with the first doped regions on both sides of the first isolation structure, which is equivalent to that two memory cells share one gate, that is, two semiconductor cells are formed in one semiconductor structure, so that the size of the semiconductor device can be reduced.

The embodiments of the disclosure are explained in detail below with reference to the drawings. However, those of ordinary skill in the art can understand that in embodiments of the disclosure, many technical details are set forth in order to make readers better understand the disclosure. However, even without these technical details, various changes and modifications based on the following embodiments, the technical solutions claimed in this disclosure can also be realized.

Figure 1:
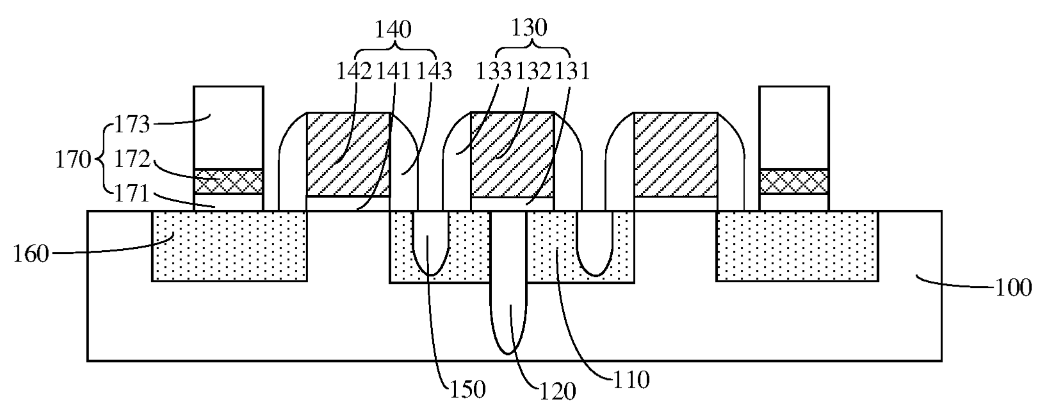
FIG. 1 is a schematic structure diagram in cross section of a semiconductor structure provided by an embodiment of the disclosure.
Figure 2:
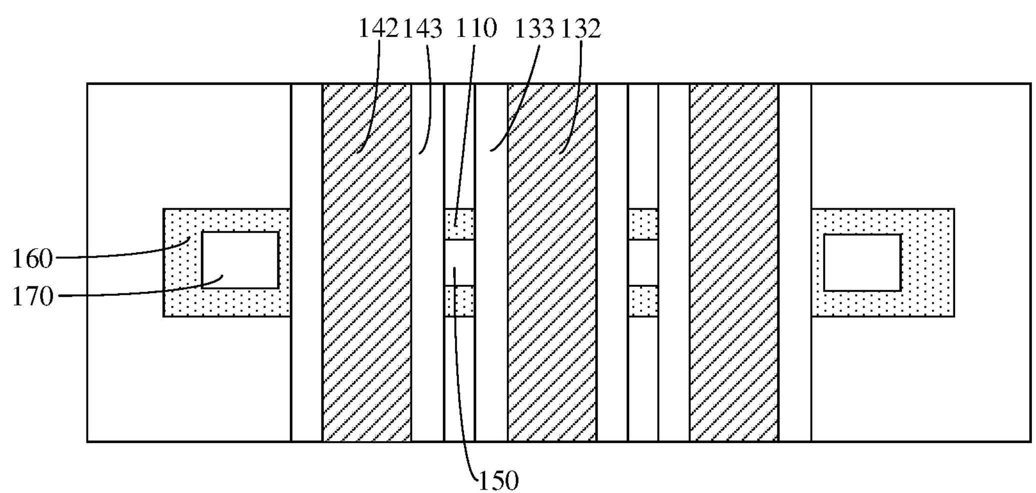
FIG. 2 is a schematic structure diagram in top view of a semiconductor structure provided by an embodiment of the disclosure.

FIG. 1 is a schematic structure diagram in cross section of a semiconductor structure provided by an embodiment of the disclosure. FIG. 2 is a schematic structure diagram in top view of a semiconductor structure provided by an embodiment of the disclosure.

Referring to FIGS. 1 and 2, the semiconductor structure includes a substrate 100 including a first doped region 110; a first isolation structure 120, in which the first isolation structure 120 is located in the first doped region 110, and the depth of the first isolation structure 120 is greater than that of the first doped region 110; a first gate structure 130, in which the first gate structure 130 is located on the surface of the substrate 100 of the first doped region 110 and spans the first isolation structure 120, and the projection width of the first gate structure 130 on the substrate 100 is greater than that of the first isolation structure 120 on the substrate 100; second gate structures 140, in which the second gate structures 140 are located on the surface of the substrate 100 and are located at both sides of the first gate structure 130. In some embodiments, the first gate structure 130 is, for example, an anti-fuse gate structure, and the second gate structures 140 are, for example, a selection gate structure. The two second gate structure 140 may share the first gate structure 130, thereby reducing the size of the semiconductor structure.

Referring to FIGS. 1 and 2, the first gate structure 130 is in contact with the first doped regions 110 on both sides of the first isolation structure 120, so that the first gate structure 130 forms memory cells with the first doped regions 110 on both sides of the first isolation structure 120 respectively. That is, the two memory cells share one gate. The second gate structures 140 are located at both sides of the first gate structure 130. In this way, the first doped region 110 may be used as a source or a drain, and forms selection transistors with the second gate structures 140. Each memory cell and the selection transistor at either side of the first gate structure 130 form one semiconductor cell. That is, in one semiconductor structure, two semiconductor cells can be formed. Compared with that one semiconductor cell is formed in one semiconductor structure, the space ratio of one semiconductor cell can be made smaller, thus reducing the size of the semiconductor device.

The semiconductor structure may be a memory, such as a DRAM (dynamic random access memory), a SRAM (static random-access memory) or a SDRAM (synchronous dynamic random access memory).

Referring to FIG. 1, in some embodiments, the material of the substrate 100 is a semiconductor material. Specifically, in some embodiments, the material of the substrate 100 is silicon. In other embodiments, the substrate 100 may be a germanium base, a germanium silicon base, a silicon carbide base or a silicon-on-insulator base.

Referring to FIG. 1, the depth of the first isolation structure 120 is greater than that of the first doped region 110. In this way, the first doped region 110 can be isolated into two separate parts by the first isolation structure 120, so that the first gate structure 130 is in contact with the separate first doped region 110 to form two separate memory cells. When a high voltage is applied to one of the memory cells, due to the existence of the first isolation structure 120, the remaining other memory cell is not broken down. Thus, two memory cells can share a same gate. That is, two semiconductor cells can be formed in a same semiconductor structure, thereby reducing the size of the semiconductor device.

Referring to FIG. 1, in some embodiments, the central axis of the first isolation structure 120 coincides with the central axis of the first gate structure 130. That is, the first gate structure 130 is isolated into two parts with a same equal area by the first isolation structure 120, so that the selection transistor (the second gate structure 140) is turned on, and the breakdown voltages of gate oxide layers located at both ends of the first isolation structure 120 are the same. Moreover, since the first doped region 110 is isolated into two equal regions by the first isolation structure 120, the length of transmission paths of electrons in the two regions are close or basically the same.

In this way, when the first gate structure 130 and the first doped regions 110 at both sides thereof in a same semiconductor structure form two memory cells, the properties of the two memory cells are close or even the same. For example, the data writing and reading rates of the memory cells are close or the same. When the semiconductor structure is made into a memory, the data writing and reading rates of circuits of the parts of the memory are balanced, which is beneficial to improve the property of the memory.

Referring to FIG. 1, in some embodiments, the first gate structure 130 includes a first gate oxide layer 131 and a first gate layer 132. The first gate oxide layer 131 spans the first isolation structure 120, and an orthographic projection of the first gate oxide layer 131 on the substrate 100 is smaller than that of the first doped region 110 on the substrate 100 The first gate layer 132 is located on the surface of the first gate oxide layer 131 away from the substrate 100. The first gate oxide layer 131 is used to isolate the first gate layer 132 from the first doped region 110 in the substrate 100, and both ends of the first gate oxide layer 131 are also in contact with the first doped region 110, so that the first gate oxide layer 131 located at one end of the first doped region 110 can be independently broken down, thereby realizing the independent control of the two memory cells. Of course, in some embodiments, the first gate oxide layer 131 located at both ends of the first doped region 110 can also be broken down at the same time, thus realizing a simultaneous control of the two memory cells.

Referring to FIG. 1, in some embodiments, since the orthographic projection of the first gate oxide layer 131 on the substrate 100 is smaller than that of the first doped region 110 on the substrate 100. That is, the width of the first gate oxide layer 131 is smaller than that of the first doped region 110. Thus, the size of the semiconductor structure can be reduced. If the width of the first gate oxide layer 131 is larger than that of the first doped region 110, part of the first gate oxide layer 131 would be in contact with the substrate 100. The substrate 100 is grounded, that is to say, the substrate 100 is in a low voltage state. When a high voltage is applied to the first gate structure 130, it is possible to break down the first gate oxide layer 131 which is in direct contact with the substrate 100. Therefore, before the second gate structure 140 is turned on, the first gate oxide layer 131 is already broken down, thus lowering the property of the semiconductor structure.

In some embodiments, the orthographic projection of the first gate oxide layer 131 on the surface of the substrate 100 may be greater than that of the first gate layer 132 on the surface of the substrate 100. In this way, the surface of the substrate 100 of the first doped region 110 may be protected by the first gate oxide layer 131, avoiding process damage to the surface of the first doped region 110 during a manufacturing procedure, thus being beneficial to improving the electrical property of the semiconductor structure. In other embodiments, the orthographic projection of the first gate oxide layer 131 on the surface of the substrate 100 may be coincident with that of the first gate layer 132 on the surface of the substrate 100. Specifically, in some embodiments, the material of the first gate oxide layer 131 may include at least one of silicon oxide, silicon nitride or silicon oxynitride.

Referring to FIG. 1, in some embodiments, the material of the first gate layer 132 may be a semiconductor material or a metal, in which the semiconductor material may be polysilicon and the metal may be any one of tungsten, copper or aluminum.

Referring to FIG. 1, the second gate structures 140 are located at both sides of the first gate structure 130. In this way, the first doped region 110 may be used as the drain or the source, and forms the selection transistors together with the second gate structures 140. During the anti-fuse programming, a voltage is applied to a second gate structure 140 to turn on a selection transistor, that is, a conductive channel is formed in the substrate 100 below the second gate structure 140. Also a programming voltage is applied to the first gate structure 130, so that carriers in the conductive channel below the second gate structure 140 pass through the first doped region 110 below the first gate structure 130 and break down the first gate oxide layer 131 of the first gate structure 130 to complete the data writing.

Referring to FIG. 1, in some embodiments, the second gate structure 140 may include a second gate oxide layer 141 and a second gate layer 142 stacked in sequence in the direction away from the substrate 100. In some embodiments, the material of the second gate oxide layer 141 may include at least one of silicon oxide, silicon nitride or silicon oxynitride. The material of the second gate layer 142 may be a semiconductor material or a metal, in which the semiconductor material may be polysilicon, and the metal may be any one of tungsten, copper or aluminum.

Referring to FIG. 1, compared with the voltage applied to the second gate structures 140 to turn on the select transistors, the programming voltage applied to the first gate structure 130 is higher. If the first gate structure 130 is too close to the second gate structures 140, that is, the selection transistors are too close to the memory cells, the properties of the select transistors are degraded in the process of breaking down the first gate oxide layer 131 of the memory cells by the higher voltage, thus affecting the reliability of a circuit. Therefore, in some embodiments, second isolation structures 150 may be further included. A second isolation structure is located between the first gate structure 130 and a second gate structure 140. The second isolation structures 150 are located in the first doped region 110, and the depth of the second isolation structures 150 is smaller than that of the first doped region 110, so that the first doped region 110 can still be used as a source or a drain of the selection transistors. Compared with that no second isolation structure 150 is provided between the first gate structure 130 and the second gate structures 140, providing the second isolation structure 150 between the first gate structure 130 and the second gate structure 140 is equivalent to increasing the distance between the first gate structure 130 and the second gate structure 140 in a direction perpendicular to the surface of the substrate 100, that is, increasing the distance between the selection transistor and the memory cell, so that the damage to the selection transistors caused when the memory cells are written by a higher voltage due to the selection transistors that are too close to the memory cells can be suppressed. Furthermore, the selection transistors are too close to the memory cells in the directions from the first gate structure 130 to the second gate structures 140, which is beneficial to reducing the size of the semiconductor device.

Referring to FIG. 1, in some embodiments, the projection width of the second isolation structures 150 on the substrate 100 is smaller than the distance between the first and second gate structures 130 and 140. That is, the width of the second isolation structures 150 is smaller than the distance between the first and second gate structures 130 and 140. Because the second isolation structures 150 are located in the first doped region 110 between the first gate structure 130 and the second gate structures 140, the provision of the second isolation structures 150 of a smaller width allows a larger area of the first doped region 110 between the first gate structure 130 and the second gate structures 140. As a result, the concentration of doped ions in the first doped region 110 therebetween is higher, which is beneficial to the transmission of carriers. Therefore, a good property of the selection transistors can be maintained, and then the problem that a conductive path may not be formed between the first gate structure 130 and the second gate structures 140 due to the width of the second isolation structures 150 that is larger can be avoided.

Referring to FIG. 1, in some embodiments, the first gate structure 130 may include a first sidewall structure 133, and a second gate structure 140 may include a second sidewall structure 143. In some embodiments, the first sidewall structure 133 covers the sidewalls of the first gate oxide layer 131 and the first gate layer 132, and the distance between the first sidewall structure 133 and the second sidewall structure 143 may be smaller than the width of the second isolation structures 150. The first sidewall structure 133 and the second sidewall structure 143 are used to protect the first gate structure 130 and the second gate structures 140, respectively. The distance between the first sidewall structure 133 and the second sidewall structure 143 is smaller than the width of the second isolation structures 150, which is beneficial to further reducing the distance between the first gate structure 130 and the second gate structure 140 in the horizontal direction, so that the size of the semiconductor structure can be further reduced. On the other hand, the width of the second isolation structures 150 is relatively large, so that the distance between the first gate structure 130 and the second gate structure 140 is relatively large in the direction perpendicular to the surface of the substrate 100, that is, in the vertical direction, which can suppress the damage to the selection transistors caused when the memory cells are written by a high voltage due to the selection transistors that are too close to the memory cells.

Figure 3:
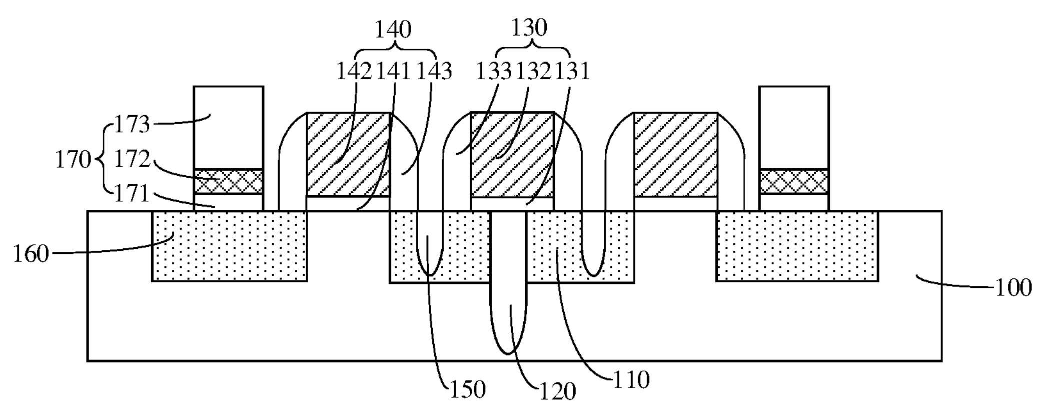
FIG. 3 is another schematic structure diagram in cross section of a semiconductor structure provided by an embodiment of the disclosure.

Referring to FIG. 3, which is another schematic structure diagram in cross section of a semiconductor structure provided by an embodiment of the disclosure. In some other embodiments, the first gate structure 130 may include a first sidewall structure 133, and a second gate structure 140 may include a second sidewall structure 143. In some embodiments, the first sidewall structure 133 covers the sidewalls of the first gate oxide layer 131 and the first gate layer 132, and the distance between the first sidewall structure 133 and a second sidewall structure may be equal to the width of the second isolation structures 150. In yet some embodiments, the distance between the first sidewall structure 133 and a second sidewall structure 143 may be larger than the width of the second isolation structures 150. In some embodiments, the materials of the first sidewall structure 133 and the second sidewall structures 143 may be either silicon oxide or silicon nitride.

Referring to FIGS. 1 and 2 again, in some embodiments, second doped regions 160 may be further included, which are located in the substrate 100. A second doped region 160 is located at a side of a second gate structure 140 away from the first doped region 110. The second doped region 160 may be used as another source or drain of the selection transistors. When a voltage is applied to the second gate structure 140, a conductive channel can be formed between the second doped region 160 and the first doped region 110 to conduct the first doped region 110 and the second doped region 160, so that the carriers can be transferred from the second doped region 160 to the first doped region 110.

Referring to FIGS. 1 and 2, in some embodiments, bit line structures 170 may be further included. The bit line structures 170 are located on the surface of the substrate 100 of the second doped regions 160. In some embodiments, a bit line structure 170 may include a barrier layer 171, a conductive layer 172 and an insulating layer 173 which are stacked in a direction away from the substrate 100 in sequence. The barrier layer 171 is used to prevent a mutual diffusion between the conductive layer 172 and the second doped region 160, and the insulating layer 173 is used to isolate the conductive layer 172 from other conductive devices in the semiconductor structure. Specifically, in some embodiments, the second doped regions 160 located at both sides of the first doped region 110 may be connected to different bit line structures 170, respectively, so that the data of the two memory cells can be read out, respectively. Of course, in some embodiments, the second doped regions 160 located at both sides of the first doped region 110 may also be connected to a same bit line structure 170, thus realizing a simultaneous control of the two memory cells.

In some embodiments, the ion doping type of the first doped region 110 is the same as that of the second doped regions 160, and the ion doping type of the first doped region 110 is opposite to that of the substrate 100, so that the first doped region 110 and the second doped regions 160 can form a PN junction with the substrate 100, respectively. Specifically, in some embodiments, the first doped region 110 and the second doped regions 160 may be doped with N-type ions, and the substrate 100 may be doped with P-type ions. In other embodiments, the first doped region 110 and the second doped regions 160 may also be doped with P-type ions, and the substrate 100 may be doped with N-type ions. In some embodiments, the N-type ions may be at least one of arsenic ions, phosphorus ions or antimony ions, and the P-type ions may be at least one of boron ions, indium ions or gallium ions.

In some embodiments, a second isolation structure 150 may be a third doped region, and the ion doping type of the third doped region is opposite to that of the first doped region 110. That is, the ion type in the third doped region is opposite to that in the second doped region 160. Therefore, when a conductive channel under a second gate structure 140 is turned on, the type of the carriers transported in the conductive channel is opposite to the ion type in the third doped region, so that the carriers transported under the second gate structure 140 do not enter the third doped region. Thus, the third doped region plays an isolation role. In some embodiments, the ion doping type of the third doped region may be a P-type, and the ion doping type of the first doped region 110 may be an N-type. In other embodiments, the ion doping type of the third doped region may be an N type, and the ion doping type of the first doped region 110 may be a P type.

In some embodiments, the ion doping concentration of the third doped region is greater than that of the first doped region 110, whereby the carriers can be better blocked from entering the second isolation structures 150. Thus, the second isolation structures 150 have a better isolation effect.

Figure 4:
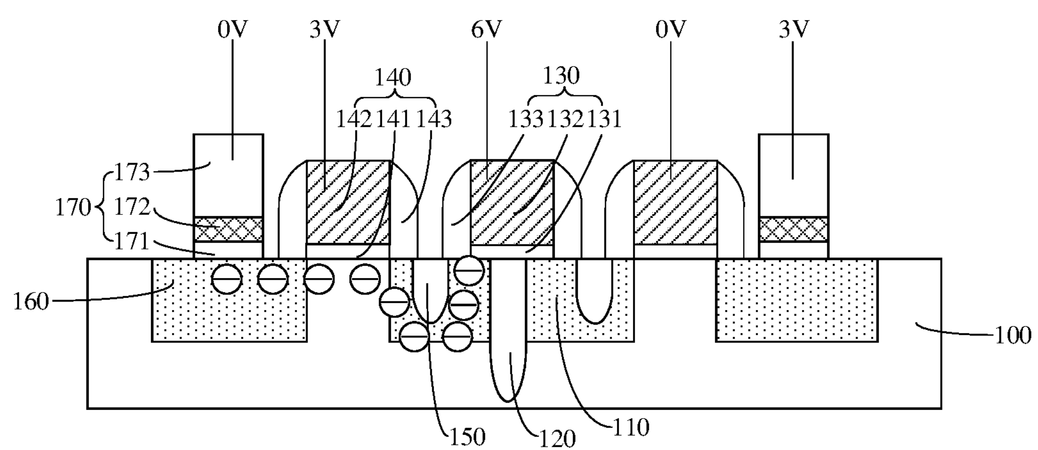
FIG. 4 is a schematic diagram of a principle of data writing of a semiconductor structure provided by an embodiment of the disclosure.
Figure 5:
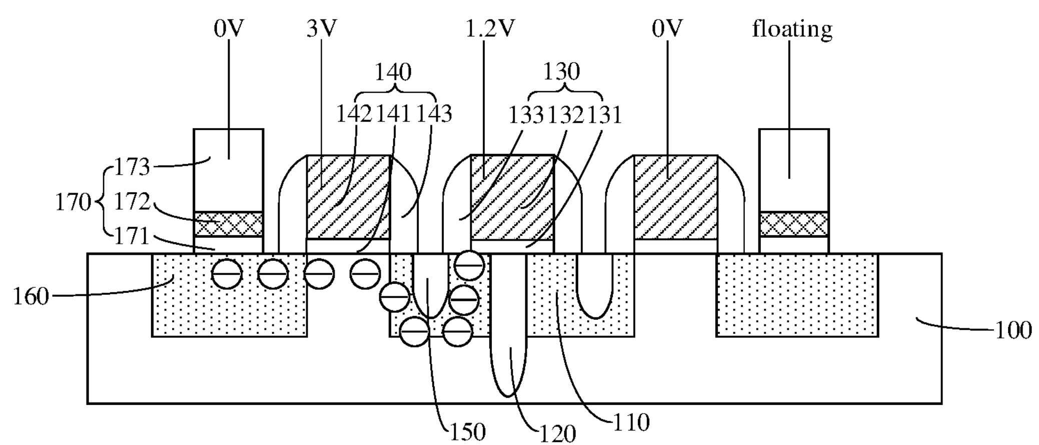
FIG. 5 is a schematic diagram of a principle of data reading of a semiconductor structure provided by an embodiment of the disclosure.
Figure 6:
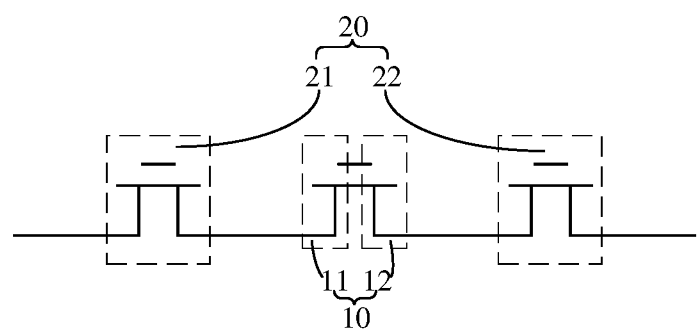
FIG. 6 is a schematic diagram of an equivalent circuit corresponding to the semiconductor structure in FIG. 1.

In other embodiments, the second isolation structures 150 may not be doped with ions. For example, the first isolation structure 120 and the second isolation structures 150 each may be a shallow trench isolation structure. The materials filled in the first isolation structure 120 and the second isolation structures 150 may include at least one of silicon oxide, silicon nitride, silicon carbonitride or silicon oxycarbonitride. It can be understood that the first isolation structure 120 is provided as an isolation structure without doping ions. This is because due to the substrate being grounded, if the first isolation structure 120 is an ion-doped region, a high voltage difference is formed between the first gate structure 130 and the first isolation structure 120 when a voltage is applied to the first gate structure 130, which may break down the first gate oxide layer 131 at the bottom of the first gate structure 130. In this way, the first gate oxide layer 131 of the first gate structure 130 cannot be selectively broken down, so that data accesses to the two memory cells cannot be done, respectively. Therefore, in the embodiments of the disclosure, the first isolation structure 120 is provided as an isolation structure without doping ions, and the depth of the first isolation structure 120 is greater than that of the first doped region 110, so that the first gate structure 130 and the first doped region form the two memory cells. FIG. 4 is a schematic diagram of the principle of data writing of a semiconductor structure provided by an embodiment of the disclosure. FIG. 5 is a schematic diagram of the principle of data reading of a semiconductor structure provided by an embodiment of the disclosure. FIG. 6 is a schematic diagram of an equivalent circuit corresponding to the semiconductor structure in FIG. 1. Referring to FIGS. 4 and 5, the position of one selection transistor in the semiconductor structure is regarded as the left side, and the position of the other selection transistor in the semiconductor structure is regarded as the right side. During the anti-fuse programming, a voltage is applied to the second gate structure 140 at the left side to turn on the selection transistor at the left side. That is, a conductive channel is formed in the substrate 100 below the second gate structure 140 at the left side Also a programming voltage is applied to the first gate structure 130, making the carriers in the conductive channel below the second gate structure 140 at the left side pass through the first doped region 110 below the first gate structure 130 and break down the first gate oxide layer 131 at the left side of the first isolation structure 120 to complete the data writing. At this time, since the selection transistor at the right side is not turned on, the first gate oxide layer 131 at the right side of the first isolation structure 120 will not be broken down, thus realizing respective data writings to the two memory cells in the semiconductor structure. Of course, in some embodiments, the first gate oxide layer 131 at both sides of the first isolation structure 120 can also be broken down at the same time, thereby realizing simultaneous data writings to the two memory cells in the semiconductor structure.

Referring to FIG. 6, a memory circuit includes two memory cells 10 and two selection transistors 20. Gates of the two memory cells 10 are electrically connected, and a source or drain of a selection transistor 20 is electrically connected to an end of one memory cell 10. Gates of the selection transistors 20 are connected to a word line. One of a source or drain of a selection transistor 20 is connected to a bit line, and the other of the source or drain of the selection transistor 20 is electrically connected to an end of a memory cell 10. In some embodiments, the memory cells 10 may include a first memory cell 11 and a second memory cell 12. The selection transistors 20 may include a first selection transistor 21 electrically connected to the first memory cell 11 and a second selection transistor 22 electrically connected to the second memory cell 12.

Referring to FIGS. 4 and 6, in some embodiments, the process of writing data to the first memory cell 11 in the memory circuit may be as follows: applying a voltage to a word line of the first selection transistor 21 to turn on the first selection transistor 21, for example, applying a voltage of 3V. A high voltage is applied to the first memory cell 11, and a low voltage is applied to a bit line structure 170 (for example, grounded), so that a high voltage difference is formed between the first memory cell 11 and the bit line. The high voltage difference causes the first gate oxide layer 131 of the first memory cell 11 (the first gate oxide layer 131 at the left side of the first isolation structure 120) to be broken down. A low-resistance path is formed between the first memory cell 11 and the drain (the first doped region 110 at the left side of the first isolation structure 120), thereby completing data writing. In some embodiments, when a lower voltage is applied to the bit line structure 170 at the right side, the first gate oxide layer 131 located at the right side of the first isolation structure 120 can also be broken down, thereby realizing data writing to the second memory cell 12. Of course, the first gate oxide layer 131 at both sides of the first isolation structure 120 may also be broken down at the same time, so as to realize a simultaneous data writing to the first memory cell 11 and the second memory cell 12.

Referring to FIGS. 5 and 6, the process of reading data from the first memory cell 11 in the memory circuit may be as follows: the first gate oxide layer 131 of the first memory cell 11 has been broken down to form a low resistance state. When a voltage is applied to the first memory cell 11, it is equivalent to applying a reading voltage to the drain of the first memory cell 11 (the first doped region 110 on the left side of the first isolation structure 120). When a voltage is applied to the first selection transistor 21, a path is formed between the source (the second doped region 160) and the drain. Thus, a low voltage can be applied to the first memory cell 11, and a large current can pass through the path in real time, so as to realize the data reading. In some embodiments, the data reading may also be performed from the second memory cell 12, or the data reading may also be performed from the first memory cell 11 and the second memory cell 12 at the same time.

In the semiconductor structure provided by the above embodiments, the first isolation structure 120 is arranged in the first doped region 110 of the substrate 100, and the depth of the first isolation structure 120 is greater than that of the first doped region 110. That is, the first isolation structure 120 isolates the first doped region 110 into two separate parts. The first gate structure 130 is located on the surface of the substrate 100 of the first doped region 110. The first gate structure 130 spans the first isolation structure 120, and the projection width of the first gate structure 130 on the substrate 100 is greater than that of the first isolation structure 120 on the substrate 100. That is, the first gate structure 130 is in contact with the first doped region 110 on both sides of the first isolation structure 120, and the first gate structure 130 form the memory cells with the first doped region 110 on both sides of the first isolation structure 120 respectively. The second gate structures 140 are located on the surface of the substrate 100, and are located at both sides of the first gate structure 130. In this way, the first doped region 110 may be used as a source or drain, and forms the selection transistors together with the second gate structures 140. In the embodiments of the disclosure, the first gate structure 130 spans the first isolation structure 120 and is in contact with the first doped regions 110 on both sides of the first isolation structure 120, which is equivalent to two memory cells sharing one gate, that is, two semiconductor cells are formed in one semiconductor structure. Thus, the size of the semiconductor device can be reduced.

Accordingly, another embodiments of the disclosure provides a method for manufacturing a semiconductor structure, which can form the semiconductor structure provided in the previous embodiments. The method for manufacturing a semiconductor structure provided in another embodiments of the disclosure will be described in detail below with reference to the drawings.

FIG. 7 to FIG. 10 are structural schematic diagrams corresponding to the steps in a method for manufacturing a semiconductor structure provided by another embodiments of the disclosure.

Figure 7:
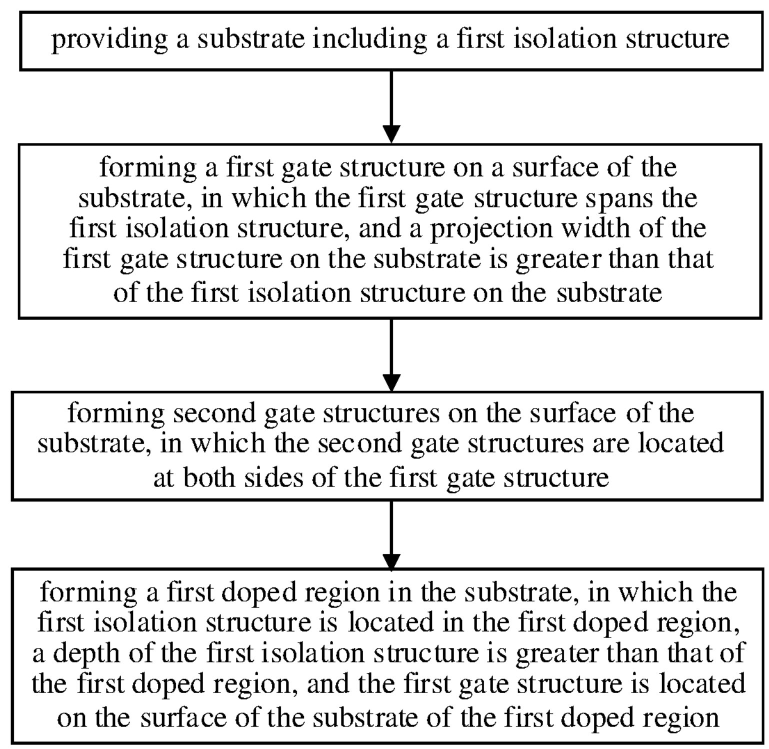
FIG. 7 is a flowchart of a method for manufacturing a semiconductor structure provided by an embodiment of the disclosure.
Figure 8:
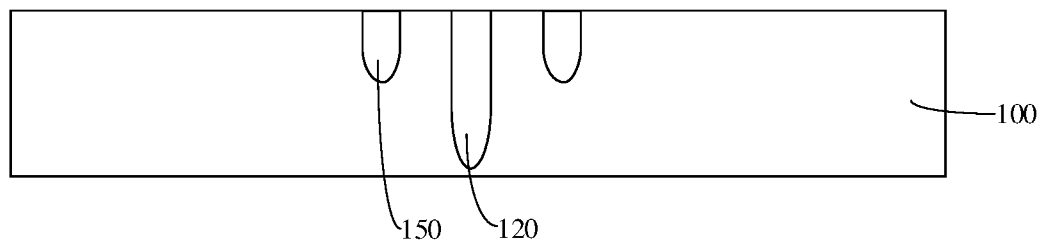
FIG. 8 is a schematic structure diagram corresponding to a step of providing a substrate in a method for manufacturing a semiconductor structure provided by an embodiment of the disclosure.

FIG. 7 is a flowchart of a method for manufacturing a semiconductor structure provided by an embodiment of the disclosure, and FIG. 8 is a structural schematic diagram corresponding to a step of providing a substrate in a method for manufacturing a semiconductor structure provided by an embodiment of the disclosure. Referring to FIGS. 7 and 8, a substrate 100 is provided. The substrate 100 includes a first isolation structure 120. In some embodiments, the material of the substrate 100 is a semiconductor material. Specifically, in some embodiments, the material of the substrate 100 is silicon. In other embodiments, the substrate 100 may be a germanium base, a germanium silicon base, a silicon carbide base or a silicon-on-insulator base.

Referring to FIG. 8, the first doped region 110 formed subsequently in the substrate 100 can be isolated into two parts which are separate from each other by the first isolation structure 120, so that the first gate structure 130 subsequently formed is in contact with the separate first doped region 110 respectively to form two separate memory cells. In some embodiments, the first isolation structure 120 may be a shallow trench isolation structure. The method for forming the first isolation structure 120 may include patterning the surface of the substrate 100 to define an opening position of the first isolation structure 120; etching the patterned surface of the substrate 100 to form a first trench with a set depth in the substrate 100; and depositing an isolation material in the first trench to form the first isolation structure 120. In some embodiments, the isolation material may include at least one of silicon oxide, silicon nitride, silicon carbonitride or silicon oxycarbonitride.

In some embodiments, second isolation structures 150 may be formed before the first gate structure is formed. That is, at the same time when the first isolation structure 120 is formed, the second isolation structures 150 may also be formed in the substrate 100. In this case, since the first gate structure 130 has not been formed on the surface of the substrate 100, a large process operation space is provided for forming the second isolation structures 150, and the width of the formed second isolation structures 150 can be easily controlled, which is conductive to improving the efficiency of forming the second isolation structures 150. The second isolation structures 150 are located at both sides of the first isolation structure 120, so that when second doped regions are formed subsequently in the substrate 100, the second isolation structures 150 are located in the second doped region, which can increase the distance between the first gate structure 130 and a second gate structure 140, which are formed subsequently on the surface of the substrate 100 in the vertical direction, and suppress a damage to the second gate structure 140 caused when the first gate structure 130 is written by a high voltage due to the first gate structure 130 that is too close to the second gate structure 140.

In some embodiments, the method for forming a second isolation structure 150 may include patterning the surface of the substrate 100 to define an opening position of the second isolation structure 150; etching the patterned surface of the substrate 100 to form a second trench with a set depth in the substrate 100; and depositing an isolation material in the second trench to form a first isolation structure 120.

Figure 9:
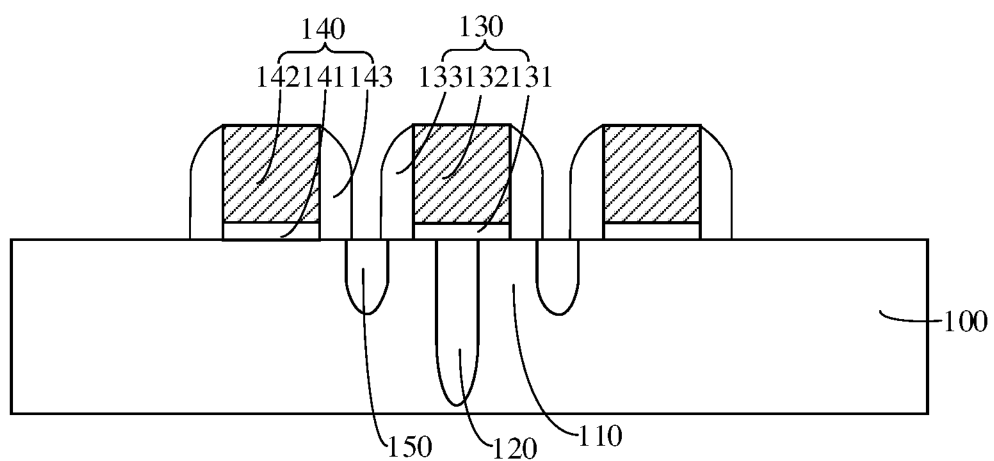
FIG. 9 is a schematic structure diagram corresponding to a step of forming a first gate in a method for manufacturing a semiconductor structure provided by an embodiment of the disclosure.

FIG. 9 is a schematic structure diagram corresponding to a step of forming a first gate in a method for manufacturing a semiconductor structure provided by an embodiment of the disclosure. Referring to FIGS. 7 and 9, the first gate structure 130 is formed on the surface of the substrate 100. The first gate structure 130 spans the first isolation structure 120, and a projection width of the first gate structure 130 on the substrate 100 is greater than that of the first isolation structure 120 on the substrate 100.

Referring to FIG. 9, the first gate structure 130 is isolated into a first part and a second part by the first isolation structure 120. In this way, when a programming voltage is applied to the first part of the first gate structure 130 to break down the first gate oxide layer 131 of the first part of the first gate structure 130, the first gate oxide layer 131 of the second part of the first gate structure 130 cannot be broken down, so that respective breakdown, i.e., respective data writings, of the first part and the second part of the first gate structure 130 can be realized.

Referring to FIG. 9, in some embodiments, the formed first gate structure 130 may include a first gate oxide layer 131 and a first gate layer 132 which are stacked in sequence in a direction away from the substrate 100. The first gate oxide layer 131 is used to isolate the first gate layer 132 from the first doped region 110 of the substrate 100. In some embodiments, the first gate structure 130 may further include a first sidewall structure 133 covering sidewalls of the first gate oxide layer 131 and the first gate layer 132 and used for protecting the first gate layer 132 and the first gate oxide layer 131. In some embodiments, the method for forming the first gate structure 130 may include: forming the first gate oxide layer 131 and the first gate layer 132 stacked in sequence on the surface of the substrate 100 by a deposition process; and forming a first sidewall structure 133 on the sidewalls of the first gate oxide layer 131 and the first gate layer 132 by a deposition process. Specifically, in some embodiments, the deposition process may include any one of a chemical vapor deposition process, a physical vapor deposition process, an atomic layer deposition process, or a metal organic chemical vapor deposition process. In some embodiments, the material of the first gate oxide layer 131 may include at least one of silicon oxide, silicon nitride or silicon oxynitride. The material of the first gate layer 132 may be a semiconductor material or a metal, in which the semiconductor material may be polysilicon, and the metal may be any one of tungsten, copper or aluminum. The material of the first sidewall structure 133 can be either silicon oxide or silicon nitride.

Referring to FIG. 9, in some embodiments, the second gate structures 140 may be formed on the surface of the substrate 100 while the first gate structure 130 is formed. The second gate structures 140 are located at both sides of the first gate structure 130. Thus, the first doped regions 110 subsequently formed on both sides of the first isolation structure 120 may serve as either a gate or a source, and form the selection transistors together with the second gate structures 140. The first gate structure 130 form memory cells with the first doped regions 110 subsequently formed on both sides of the first isolation structure 120 respectively. One selection transistor and one memory cell form one semiconductor cell. In the embodiments of the disclosure, it is equivalent to forming two semiconductor cells in one semiconductor structure, thereby reducing the size of the semiconductor device. In some embodiments, the second gate structures 140 may be the same as the first gate structure 130, and the method for forming the second gate structures 140 may be the same as that for forming the first gate structure 130. Therefore, the first gate structure 130 and the second gate structures 140 may be formed at the same time in a same step, which is beneficial to simplify the process flow.

Figure 10:
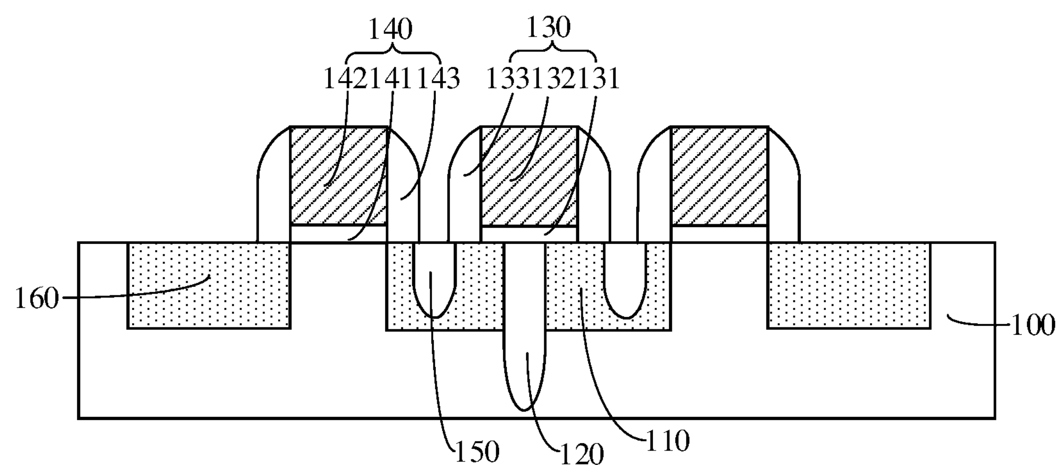
FIG. 10 is a schematic structure diagram corresponding to a step of forming a first doped region in a method for manufacturing a semiconductor structure provided by an embodiment of the disclosure.

FIG. 10 is a schematic structure diagram corresponding to a step of forming a first doped region in a method for manufacturing a semiconductor structure provided by an embodiment of the disclosure. Referring to FIGS. 7 and 10, the first doped region 110 is formed in the substrate 100. The first isolation structure 120 is located in the first doped region 110, and a depth of the first isolation structure 120 is greater than that of the first doped region 110. The first gate structure 130 is located on the surface of the substrate 100 of the first doped region 110.

Referring to FIG. 10, the depth of the first isolation structure 120 is greater than that of the first doped region 110, so that the first doped region 110 can be isolated to form two separate first doped regions 110 by the first isolation structure 120. In some embodiments, the first doped region 110 is doped with either N-type ions or P-type ions. The N-type ions may be at least one type of arsenic ions, phosphorus ions or antimony ions, and the P-type ions may be at least one type of boron ions, indium ions or gallium ions. In some embodiments, ions can be implanted into the substrate 100 by a combination of a vertical implantation process and an oblique implantation process into the surface of the substrate 100 to form the first doped region 110. By this way, the efficiency of ion implantation is higher.

In some embodiments, the formed second isolation structure 150 is located in the first doped region 110, and a depth of the second isolation structure 150 is smaller than that of the first doped region 110. In this way, the first doped region 110 may be used as either a source or a drain, and forms the selection transistors together with the second gate structures 140. Moreover, the distance between the first gate structure 130 and a second gate structure 140 is increased in a direction perpendicular to the surface of the substrate 100, that is, the distance between the selection transistor and the memory cell is increased, so that the damage to the selection transistor caused when the memory cell is written by a high voltage due to the selection transistor that is too close to the memory cell can be suppressed. In addition, in the direction from the first gate structure 130 to a second gate structure 140, the distance between the selection transistor and the memory cell is relatively short, which is beneficial to reducing the size of the semiconductor device.

It is to be noted that in some embodiments, the second isolation structure may be formed at the same time as the first isolation structure is formed. In other embodiments, the second isolation structure 150 may be formed after the first doped region 110 is formed, that is, after the first gate structure 130 and the second gate structures 140 are formed. In this case, the first gate structure 130 and the second gate structures 140 may be used as a mask to form the second isolation structures 150 between the first gate structure 130 and the second gate structures 140.

Referring to FIG. 10, in some embodiments, the second isolation structure 150 may be a third doped region, an ion doping concentration of which is greater than that of the first doped region 110, and an ion doping type of which is opposite to that of the first doped region 110. In this way, when a conductive channel under a second gate structure 140 is turned on, the carriers transported under the second gate structure 140 do not enter into the third doped region because the type of carriers transported in the conductive channel is opposite to the ion type in the third doped region. Thus, the third doped region plays an isolation role. In this way, the third doped region can better block carriers from entering the second isolation structure 150, and thus the second isolation structure 150 has a better isolation effect.

Referring to FIG. 10, it can be understood that in some other embodiments, the second isolation structure 150 may not be doped with ions. For example, the first isolation structure 120 and the second isolation structure 150 each may be a shallow trench isolation structure.

Referring to FIG. 10, in some embodiments, the method further includes forming second doped regions 160 in the substrate 100, A second doped region 160 is located at the side of the second gate structure 140 away from the first doped region 110. In some embodiments, the first doped region 110 and the second doped region 160 may be used as a source and a drain, and form the selection transistors with the second gate structures 140. When a voltage is applied to a second gate structure 140, a conductive channel can be formed between a second doped region 160 and the first doped region 110 to conduct the first doped region 110 and the second doped region 160, so that carriers can be transferred from the second doped region 160 to the first doped region 110. In some embodiments, the second doped regions 160 may be doped with the same type of ions as the first doped region 110. Specifically, in some embodiments, the second doped regions 160 may be formed by the same process steps as the first doped region 110. Therefore, the first doped region 110 and the second doped regions 160 may be formed in the same process steps, which is beneficial to improving the efficiency of the preparation process.

Referring to FIG. 7 and FIG. 1, in some embodiments, the method further includes forming bit line structures 170 on the surface of the substrate 100 of the second doped regions 160. In some embodiments, a bit line structure 170 may include a barrier layer 171, a conductive layer 172 and an insulating layer 173 stacked in sequence in the direction away from the substrate 100. In some embodiments, the conductive layer 172 may be a metal, for example, any one of tungsten, copper or aluminum. In other embodiments, the conductive layer 172 may also be a semiconductor material, for example, polysilicon. The barrier layer 171 is used to prevent a mutual diffusion between the conductive layer 172 and the second doped region 160, and the material of the barrier layer 171 may be titanium nitride. The insulating layer 173 is used to isolate the conductive layer 172 from other conductive devices in the semiconductor structure. The material of the insulating layer 173 may be either silicon oxide or silicon nitride.

In the method for manufacturing a semiconductor structure provided by the above embodiments, the substrate 100 includes a first isolation structure 120. The first gate structure 130 is formed on the surface of the substrate 100. The first gate structure 130 spans the first isolation structure 120, and the projection width of the first gate structure 130 on the substrate 100 is greater than that of the first isolation structure 120 on the substrate 100. That is, the first gate structure 30 is isolated into a first part and a second part by the first isolation structure 120. The second gate structures 140 are formed on the surface of the substrate 100. The second gate structures 140 are located at both sides of the first gate structure 130. The first doped region 110 is formed in the substrate 100. The first isolation structure 120 is located in the first doped region 110, and the depth of the first isolation structure 120 is greater than that of the first doped region 110. The first gate structure 130 is located on the surface of the substrate 100 of the first doped region 110. In this way, the first doped region 110 may be used as either a source or a drain, and forms the selection transistors together with the second gate structures 140. Moreover, the first part and the second part of the first gate structure 130 are in contact with the first doped region 110, respectively, to form two memory cells, which is equivalent to that two memory cells share one gate. One memory cell and one selection transistor form one semiconductor cell, which is equivalent to that two semiconductor cells are formed in one semiconductor structure, thereby reducing the size of the semiconductor device.

It can be understood by those skilled in the art that the above-mentioned implementation modes are specific embodiments to realize the disclosure. In practical application, various changes in form and details can be made without departing from the spirit and scope of the disclosure. Any person skilled in the art can make his own changes and modifications without departing from the spirit and scope of this disclosure, so the scope of protection of this disclosure shall be subject to the scope defined by the claims.

The invention claimed is:

1. A semiconductor structure, comprising:

a substrate comprising a first doped region;

a first isolation structure, wherein the first isolation structure is located in the first doped region, and a depth of the first isolation structure is greater than a depth of the first doped region;

a first gate structure, wherein the first gate structure is located on a surface of the substrate of the first doped region and spans the first isolation structure, and a projection width of the first gate structure on the substrate is greater than a projection width of the first isolation structure on the substrate;

second gate structures, wherein the second gate structures are located on a surface of the substrate and at both sides of the first gate structure; and second doped regions located in the substrate, wherein a second doped region is located at a side of a second gate structure away from the first doped region.

2. The semiconductor structure according to claim 1, wherein a central axis of the first isolation structure coincides with a central axis of the first gate structure.

3. The semiconductor structure according to claim 1, wherein the semiconductor structure further comprises second isolation structures, wherein a second isolation structure is located between the first gate structure and a second gate structure, the second isolation structure is located in the first doped region, and a depth of the second isolation structure is smaller than the depth of the first doped region.

4. The semiconductor structure according to claim 3, wherein a projection width of the second isolation structure on the substrate is smaller than a distance between the first gate structure and the second gate structure.

5. The semiconductor structure according to claim 3, wherein the first gate structure comprises a first sidewall structure, and a second gate structure comprises a second sidewall structure, wherein a distance between the first sidewall structure and the second sidewall structure is less than or equal to a width of the second isolation structure.

6. The semiconductor structure according to claim 3, wherein the second isolation structure is a third doped region, wherein an ion doping type of the third doped region is opposite to an ion doping type of the first doped region.

7. The semiconductor structure according to claim 6, wherein an ion doping concentration of the third doped region is greater than an ion doping concentration of the first doped region.

8. The semiconductor structure according to claim 1, wherein an ion doping type of the first doped region is same as an ion doping type of the second doped regions and opposite to an ion doping type of the substrate.

9. The semiconductor structure according to claim 1, wherein the first gate structure comprises:

- a first gate oxide layer, wherein the first gate oxide layer spans the first isolation structure, and an orthographic projection of the first gate oxide layer on the substrate is smaller than an orthographic projection of the first doped region on the substrate; and
- a first gate layer, wherein the first gate layer is located on a surface of the first gate oxide layer away from the substrate.

10. A method for manufacturing a semiconductor structure, comprising:

- providing a substrate comprising a first isolation structure;
- forming a first gate structure on a surface of the substrate, wherein the first gate structure spans the first isolation structure, and a projection width of the first gate structure on the substrate is greater than a projection width of the first isolation structure on the substrate;
- forming second gate structures on the surface of the substrate, wherein the second gate structures are located at both sides of the first gate structure;
- forming a first doped region in the substrate, wherein the first isolation structure is located in the first doped region, a depth of the first isolation structure is greater than a depth of the first doped region, and the first gate structure is located on the surface of the substrate of the first doped region; and
- forming second doped regions in the substrate, wherein a second doped region is located at a side of a second gate structure away from the first doped region.

11. The method for manufacturing a semiconductor structure according to claim 10, further comprising: before forming the first gate structure, forming second isolation structures in the substrate of the first doped region, wherein a second isolation structure is located between the first gate structure and a second gate structure, and a depth of the second isolation structure is smaller than the depth of the first doped region.

12. The method for manufacturing a semiconductor structure according to claim 10, further comprising: after forming the first doped region, forming second isolation structures in the substrate of the first doped region, wherein a second isolation structure is located between the first gate structure and a second gate structure, and a depth of the second isolation structure is smaller than the depth of the first doped region.

13. The method for manufacturing a semiconductor structure according to claim 12, wherein the second isolation structure is a third doped region, wherein an ion doping concentration of the third doped region is greater than an ion doping concentration of the first doped region, and an ion doping type of the third doped region is opposite to an ion doping type of the first doped region.

14. A semiconductor structure, comprising:

- a substrate comprising a first doped region;
- a first isolation structure, wherein the first isolation structure is located in the first doped region, and a depth of the first isolation structure is greater than a depth of the first doped region;
- a first gate structure, wherein the first gate structure is located on a surface of the substrate of the first doped region and spans the first isolation structure, and a projection width of the first gate structure on the substrate is greater than a projection width of the first isolation structure on the substrate;
- second gate structures, wherein the second gate structures are located on a surface of the substrate and at both sides of the first gate structure; and
- second isolation structures, wherein a second isolation structure is located between the first gate structure and a second gate structure, the second isolation structure is located in the first doped region, and a depth of the second isolation structure is smaller than the depth of the first doped region.

15. The semiconductor structure according to claim 14, wherein a projection width of the second isolation structure on the substrate is smaller than a distance between the first gate structure and the second gate structure.

16. The semiconductor structure according to claim 14, wherein the first gate structure comprises a first sidewall structure, and a second gate structure comprises a second sidewall structure, wherein a distance between the first sidewall structure and the second sidewall structure is less than or equal to a width of the second isolation structure.

17. The semiconductor structure according to claim 14, wherein an ion doping type of the first doped region is opposite to an ion doping type of the substrate.

* * * * *